United States Patent [19]

Yamamoto et al.

[11] Patent Number: 4,833,408

[45] Date of Patent: May 23, 1989

[54] NMR CHEMICAL SHIFT IMAGING METHOD WITH INFLUENCE OF INTENSITY DISTRIBUTION OF STATIC MAGNETIC FIELD REMOVED

[75] Inventors: Etsuji Yamamoto, Akishima; Takashi Onodera, Koganei, both of Japan

[73] Assignee: Hitachi, Ltd., Tokyo, Japan

[21] Appl. No.: 221,373

[22] Filed: Jul. 19, 1988

[30] Foreign Application Priority Data

Jul. 22, 1987 [JP] Japan .................................. 62-181122

[51] Int. Cl.[4] ............................................. G01R 33/20
[52] U.S. Cl. ..................................... 324/309; 324/307
[58] Field of Search ............... 324/300, 307, 308, 309, 324/310, 311, 312, 313, 314

[56] References Cited

U.S. PATENT DOCUMENTS

| | | | |
|---|---|---|---|
| 4,506,223 | 3/1985 | Bottomley | 324/309 |
| 4,581,582 | 4/1986 | Redington | 324/309 |
| 4,618,827 | 10/1986 | Redington | 324/309 |
| 4,654,593 | 3/1987 | Ackerman | 324/307 |
| 4,661,775 | 4/1987 | Kormos | 324/307 |
| 4,716,369 | 12/1987 | Sekihara et al. | 324/309 |
| 4,719,582 | 1/1988 | Ishida et al. | 324/312 |
| 4,740,748 | 4/1988 | Rzedzian | 324/309 |
| 4,740,753 | 4/1988 | Glover et al. | 324/320 |
| 4,752,735 | 6/1988 | Ohodera et al. | 324/309 |
| 4,766,379 | 8/1988 | Miyazaki et al. | 324/309 |

*Primary Examiner*—Michael J. Tokar
*Attorney, Agent, or Firm*—Antonelli, Terry & Wands

[57] ABSTRACT

In an NMR imaging method of distinguishing two chemical shifts of unclear spins and obtaining respective spin distribution images, 180° RF. pulses are applied twice to generate two spin echoes after spins of an object for inspection have been exicted. In the second echo among them, a pulse time-interval is so set that the time difference between the Hahn echo and the gradient echo may provide two chemical shifts with a phase difference of $2n\pi$. On the basis of information representing the distribution of a static magnetic field included in an image obtained from the second pulse, an image obtained from the first echo is compensated. By using the compensated image, spin distribution images with two chemical shifts distinguished are obtained.

5 Claims, 3 Drawing Sheets

NMR CHEMICAL SHIFT IMAGING METHOD WITH INFLUENCE OF INTENSITY DISTRIBUTION OF STATIC MAGNETIC FIELD REMOVED

BACKGROUND OF THE INVENTION

The present invention relates to an imaging method using nuclear magnetic resonance (hereafter referred to as NMR), and in particular to an imaging method for deriving a plurality of magnetization distribution images separated for respective chemical shifts.

In an imaging apparatus using the nuclear magnetic resonance phenomenon, it is necessary to separate and discriminate signals coming from an object for inspection in correspondence to respective positions. In one of such methods, a field gradient (a phase encode gradient) having a programmable time intensity product in the first direction is applied to a static magnetic field during a period lasting from excitation of nuclear spin in the object until readout of the resonance signal, and the position information of the above described direction is encoded into a spin phase. The resonance frequency is changed along a second direction by reading out the spin signal under the state that a field gradient (readout gradient) in the second direction is applied to the static magnetic field. The basic principle of this method is described in Journal of Magnetic Resonance, Vol. 18 (1975), pp. 69 to 83 and Physics in Medicine & Biology, Vol. 25 (1980), pp. 751 to 756.

As an evolution of such imaging methods, a method called chemical shift imaging is known. Since respective spins are sensitive to different magnetic fields because of difference in molecular structures around them even though they belong to an identical nuclei, resonance frequencies of respective spins change depending upon positions on the molecular structure. This phenomenon is called by the name of chemical shift.

As a method of separating spins corresponding to respective chemical shifts and imaging respective spin distributions, there is a method called Dixon's method as described in Radiology, Vol. 153 (1984), pp. 189 to 194. In this method, the sum and difference of two images obtained by respective measurement sequences which are different in phase rotation effect caused by chemical shift are calculated, and two chemical shift images (mainly corresponding to water and fat) possessed by hydrogen atoms are separated.

In actual NMR imaging apparatus, the distribution of resonance frequency caused by the intensity distribution of the static magnetic field with respect to position can not be neglected as compared with the difference in resonance frequency caused by the chemical shift even if the magnet for generating the static magnetic field is carefully produced. In the method of Yeung described in Radiology, Vol. 159 (1986), pp. 783 to 786, the above described Dixson's method is improved, and the influence of intensity distribution of a static magnetic field is removed by using the second spin echo. In the Yeung's method as well, however, images with water and fat separated are derived from the sum and difference of two images. Therefore, it is not possible to obtain two desired chemical shift image each of which has $n^2$ pixels until imaging using a measuring sequence including excitation of spins performed n times is repeated twice. Accordingly, movement of the object in a period during which the measuring sequence is repeated twice causes a large artifact.

SUMMARY OF THE INVENTION

An object of the present invention is to further shorten the measuring time of chemical shift imaging with the influence of intensity distribution of a static magnetic field removed.

Another object of the present invention is to provide a measuring sequence of chemical shift image capable of consecutively measuring a first spin echo containing chemical shift information and a second spin echo containing information of intensity distribution of a field after excitation of spin performed once.

In accordance with one feature of the present invention, a first spin echo signal obtained by supplying a predetermined phase difference different from $2n\pi$ (where n is an integer) between two chemical shifts and a second spin echo signal obtained by supplying the same phase difference of $2n\pi$ (where n is an integer) between the two chemical shifts are used. To be more concrete, the present invention has a feature that a measuring sequence includes a first step of exciting the nuclear spins of an object for inspection in a static magnetic field, a second step of applying a first 180° RF pulse, a third step of applying a first readout gradient to the above described static magnetic field so that time difference between a first Hahn echo caused by the above described first 180° pulse and a first gradient echo caused by the above described first readout gradient may provide two kinds of chemical shifts with a predetermined phase difference other than $2n\pi$, a fourth step of measuring the above described first gradient echo under the presence of the above described first readout gradient, a fifth step of applying a second 180° RF pulse after the application of the above described readout gradient has been finished, a sixth step of applying a second readout gradient to the above described static magnetic field so that time difference between a second Han echo caused by the above described second 180° RF pulse and a second gradient echo caused by the above described second readout gradient may provide the above described two kinds of chemical shifts with a phase difference of $2n\pi$, and a seventh step of measuring the above described second gradient echo under the presence of the above described second readout gradient.

DESCRIPTION OF THE PREFERRED EMBODIMENT

Figure 1:
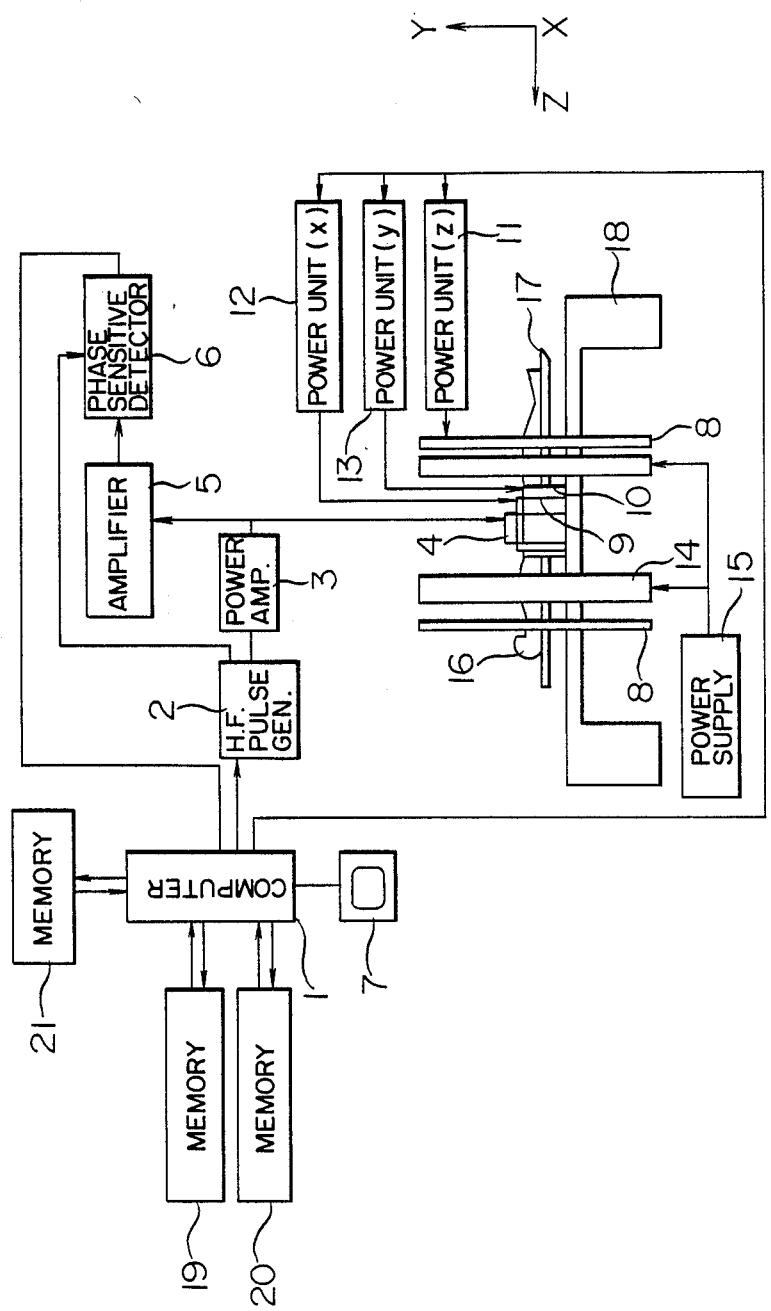
FIG. 1 schematically shows the configuration of an embodiment of an apparatus according to the present invention.

FIG. 1 is a configuration diagram of an inspection apparatus which is an embodiment of the present invention.

In FIG. 1, numeral 1 denotes a computer, 2 a high frequency pulse generator, 3 a power amplifier, 4 an RF coil for generating an RF magnetic field and detecting a signal generated by an object body 16 concurrently therewith, 5 an amplifier, and 6 a phase sensitive detector. Numerals 8, 9 and 10 denote gradient coils for generating field gradients in the z direction, x direction and y direction, respectively. Numerals 11, 12 and 13 denote power units for driving the above described coils 8, 9 and 10, respectively.

The computer 1 also has function of outputting various instructions to respective units at predetermined timing. The output of the high frequency pulse generator 2 is amplified by the power amplifier 3 to drive the above described RF coil 4. As described above, the coil 4 serves as a receiving coil as well. A received signal component is passed through the amplifier 5 and detected in the detector 6. The detected signal is then supplied to the computer 1 and converted into an image in a display 7 after signal processing.

A static magnetic field is generated by a coil 14 driven by power supply 15. A human body 16 which is an object for inspection is placed on a bed 17. The bed 17 is configured to be movable on a support base 18.

Numerals 19 and 20 denote memory units.

The measuring sequence of the embodiment will now be described by referring to FIGS. 2A to 2E. This measuring sequence is based upon a method called by the name of two-dimensional applied spin-warp imaging method. By using two-dimensional spin-warp imaging, sectional images in any direction can be obtained. However, it is now assumed a section which is parallel to the x-y plane is selected as an example. FIG. 2A shows RF pulses. FIGS. 2B, 2C and 2D show field gradients in the z direction, y direction and x direction, respectively. FIG. 2E shows a signal coming from the nuclear spins.

First of all, the field gradient $G_z$ in the z direction is applied and 90° RF pulse $P_1$ is radiated. Nuclear spins in a slice parallel to the x-y plane within a sample is inclined by 90° to excite these nuclear spins. Immediately thereafter, the field gradient $G_x$ is applied for a time-interval of length $t_x$. The $G_x$ is a field gradient for encoding position information of the x-direction into a spin phase, and is called by the name of phase encode gradient. Succeedingly, a 180° RF pulse $P_2$ is radiated under the state that $G_z$ is applied again. The radiation timing of this 180° RF pulse $P_2$ is so set that the center of the pulse may have time difference $T_E$ with respect to the center of the 90° RF pulse $P_1$. As a result, dephasing of the spins caused by intensity error distribution of a static magnetic field which does not change with time and chemical shifts of spins is cancelled at time $T_{H1}$ when time $T_E$ has further elapsed from the center of the 180° RF pulse $P_2$. In other words, the center of the Hahn echo is located at time $T_{H1}$. In addition, the spin phase is dephased according to the position in the y direction by applying the field gradient $G_y$ in the y direction during a time-interval $t_{y1}$ preceding the radiation of the 180° RF pulse $P_2$, and the spin rephase is performed by applying $G_y$ during a time-interval $t_{y2}$ succeeding $P_2$ as well. At time $T_{G1}$ in the time-interval $t_{y2}$ when the integral value of $G_y$ becomes equal to the integral value of $G_y$ in the whole duration of the time-interval $t_{y1}$, rephasing is completed. Therefore, the spin phase is dephased again. In other words, the center of the gradient echo becomes time $T_{G1}$. The time difference between the center $T_{H1}$ of the preceding Hahn echo and $T_{G1}$ is $\tau$.

A spin signal $S_1$ is obtained via the amplifier 5 and the phase sensitive detector 6 in a period within the time-interval $t_{y2}$ during which the regular intensity of $G_y$ is maintained. The spin signal $S_1$ is sampled by the computer 1. After the time-interval of $t_{y2}$ has been finished, a 180° RF pulse $P_3$ is radiated together with the field gradient $G_z$ in the z direction in order to further generate a second spin echo. The radiation timing of $P_3$ is so set that the pulse center may have time difference $T_E'$ with respect to $T_{G1}$. As a result, the center of a second Hahn echo becomes time $T_{H2}$ when time $(T_E' + \tau)$ has further elapsed from the center of the pulse $P_3$. As this time as well, however, rephasing is performed again by applying the field gradient $G_y$ in the y direction during a time-interval $t_{y3}$. As a result, the effect of dephasing of the spins obtained after $T_{H1}$ in the time-interval $t_{y2}$ is cancelled at time $T_{G2}$ so that the center of the gradient echo may coincide with $T_{G2}$. The time difference between $T_{H2}$ and $T_{G2}$ is $\tau'$. A spin signal $S_2$ during the period $t_{y3}$ is also sampled by the computer 1.

The measuring sequence heretofore described is carried out repeatedly while the magnitude of the phase encode gradient $G_x$ during the time-interval $t_x$ is successively changed as represented by broken lines of FIG. 2C. As a result, a two-dimensional data train $[S_1]$ of the spin signal in the time-interval $t_{y1}$ and a two-dimensional data train $[S_2]$ of the spin signal in the time-interval $t_{y2}$ are obtained respectively. These two-dimensional data train undergoes inverse Fourier transformation in the computer 1, respective images being obtained.

Figure 2:
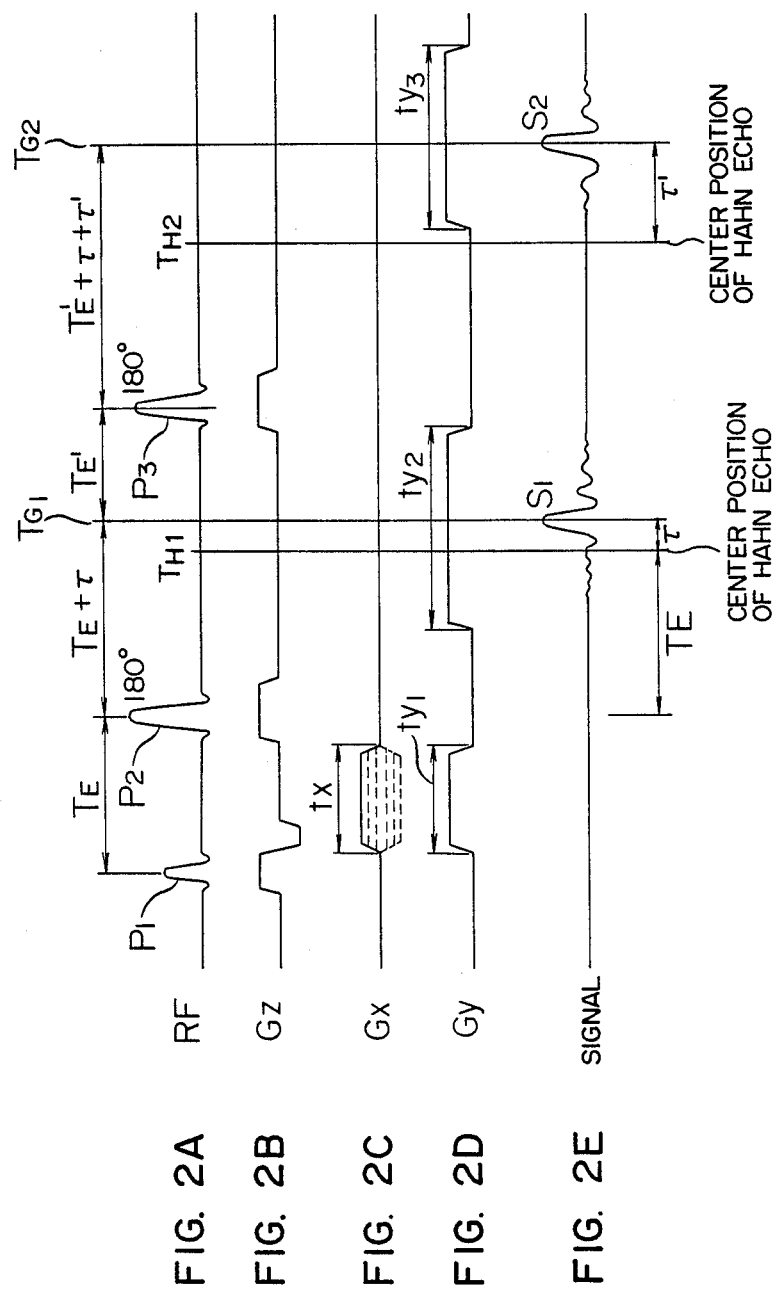
FIGS. 2A 2B, 2C, 2D and 2E are time charts showing a measuring sequence used in the above described embodiment.

Assuming now that the nuclear spins contained in an object for inspection has two kinds of chemical shifts of $\sigma_1$ and $\sigma_2$ a first image $Q_1(x, y)$ obtained by applying inverse Fourier transformation to the above described two-dimensional data train $[S_1]$ can be represented as $$Q_1(x,y) = \{\rho_1(x,y) + \rho_2(x,y) \exp(j\theta_e)\} \times \exp(j\theta_1 + j\gamma E(x,y)\tau) \quad (1)$$

where $\rho_1(x,y)$ and $\rho_2(x,y)$ are spin densities corresponding to the chemical shifts $\rho_1$ and $\rho_2$, $\gamma$ is the nuclear gyromagnetic ratio, $\theta_e$ is the phase difference caused between the two chemical shifts during the time interval $\tau$, i.e. $\theta_e = \gamma(\rho_1 - \rho_2)\tau$, $E(x,y)$ is the inhomogeneous component of the static magnetic field, $\tau$ is the time difference between the Hahn echo signal and the field gradient echo signal, and $\theta_1$ is an offset phase inherent in the apparatus which does not depend upon the position in the field of view. A second image obtained by applying inverse Fourier transformation to the two-dimensional data train $[S_2]$ can be represented as $$Q_2(x,y) = \{\rho_1(x,y) + \rho_2(x,y) \exp(j\theta_e')\} \times \exp(j\theta_2 + j\gamma E(x,y)\tau') \quad (2)$$

where $\theta_2$ is on offset phase inherent in the apparatus which does not depend upon the position in the field of view, and $\theta_e'$ is the phase difference caused between two chemical shifts during the time-interval $\tau'$. In accordance with a feature of the present embodiment, the time difference $\tau$ shown in the sequence of FIG. 2 is so set for the first echo signal that the phase difference $\theta_e$ of the spins caused between two chemical shifts may assume a value other than $2n\pi$ (where n is an integer), while the time difference $\tau'$ is so set for the second echo signal that the phase difference $\theta_e$ of the spins caused between two chemical shifts may assume a value of $2n$. At this time, the second image expressed by the equation (2) becomes $$Q_2(x,y) = \{\rho_1(x,y) + \rho_2(x,y)\} \times \exp\{j\theta_2 + j\gamma E(x,y)\tau'\} \quad (3)$$

That is to say, phase rotation caused by chemical shifts does not appear substantially at all in the complex data of each pixel of $Q_2(x,y)$. And only the phase $\gamma E(x,y)\tau'$ caused by the offset phase $\theta_2$ inherent in the apparatus and inhomogeneity of the static magnetic field is included. The offset phases $\theta_1$ and $\theta_2$ can be easily detected as described later. Therefore, the two chemical shift images $\rho_1(x,y)$ and $\rho_2(x,y)$ can be correctly derived by eliminating the offset phases $\theta_1$ and $\theta_2$ from the first and second images, deriving a term representing the phase rotation $e^{j\gamma E(x,y)\tau'}$ caused by the inhomogeneity from the second image, and compensating thereby the first image. That is to say, the first and second images with the offset phase removed can be respectively represented as $$Q_1'(x,y) = \{\rho_1(x,y) + \rho_2(x,y) \exp(j\theta_e)\} \times \exp\{j\gamma E(x,y)\tau\} \quad (5)$$

$$Q_2'(x,y) = \{\rho_1(x,y) + \rho_2(x,y)\} \times \exp\{j\gamma E(x,y)\tau'\} \quad (6)$$

From the expression (6), it follows that $$e^{j\gamma E(x,y)} = [Q_2'(x,y)/|Q_2'(x,y)|]^{\frac{1}{\tau'}} \quad (7)$$

By substituting equation (7) into equation (5), one obtains $$\rho_1(x,y) + \rho_2(x,y)\exp(j\theta_e) = Q_1'(x,y)[Q_2'(x,y)/|Q_2'(x,y)|]^{-\frac{\tau}{\tau'}} \quad (8)$$

Representing the real part and imaginary part of the right side of equation (8) respectively by $R_e$ and $I_m$, therefore, it follows that $$\rho_1(x,y) = R_e(x,y) - I_m(x,y) \cot \theta_e \quad (9)$$

$$\rho_2(x,y) = I_m(x,y) \csc \theta_e \quad (10)$$

Two chemical shift images $\rho_1(x,y)$ and $\rho_2(x,y)$ can thus be obtained.

Figure 3:
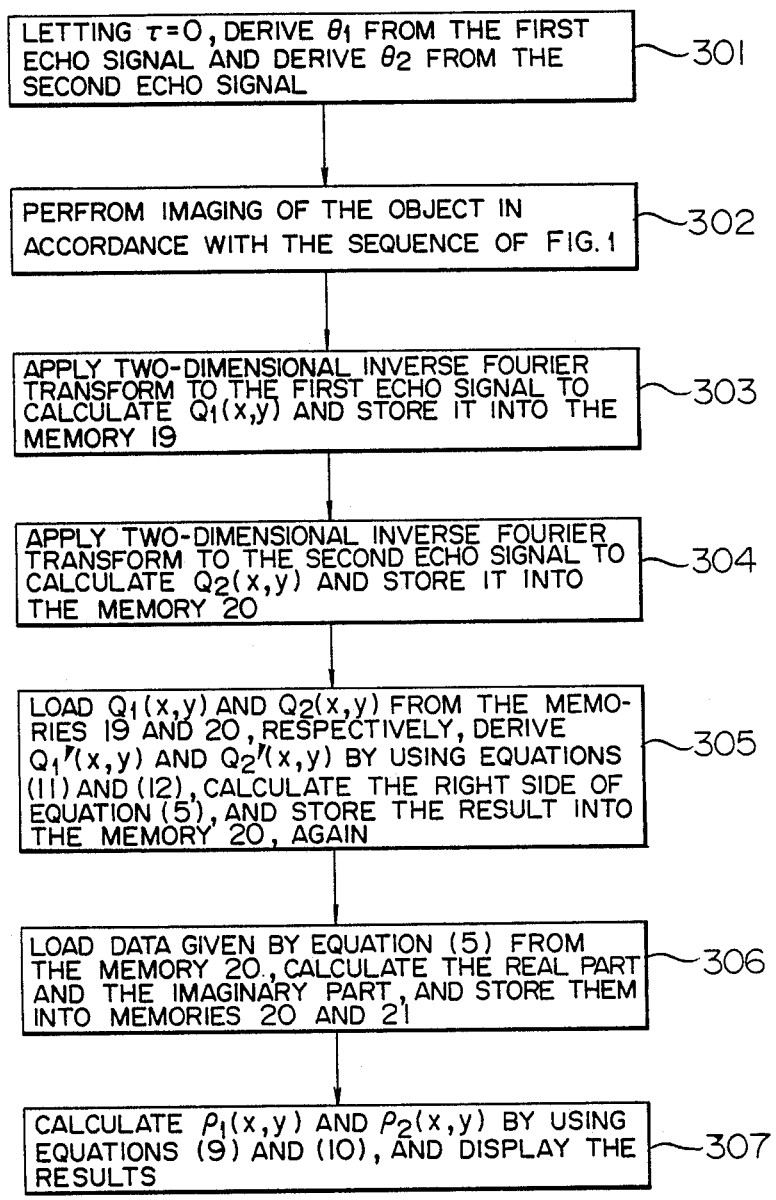
FIG. 3 is a flow chart showing the entire operation of the above described embodiment.

The whole operation of the present embodiment will now be described by referring to the flow chart of FIG. 3. First of all, an object is placed within the coil of FIG. 1 and the offset phases $\theta_1$ and $\theta_2$ inherent in the apparatus are derived at step 301. By performing imaging in a sequence obtained by partially changing the measuring sequence described with reference to FIGS. 2A to 2E and by setting timing of respective pulses so that $\tau=0$, i.e., the first Hahn echo may coincide with the first gradient echo, the above described offset phases are obtained. From the real part and the imaginary part of an image obtained by applying inverse Fourier transformation to the two-dimensional data train [S₁] of the first signal, $\theta_1$ is obtained. From the real part and imaginary part of an image obtained by applying inverse Fourier transformation to the two-dimensional data train [S₂] of the second signal, $\theta_2$ is obtained. Values of $\theta_1$ and $\theta_2$ thus derived are stored into predetermined registers of the computer 1. Succeedingly at step 302, measurement with respect to the object is performed in accordance with the measuring sequence of FIG. 2 described before in detail. The step 301 is provided simply for measuring the inherent offset of the apparatus. Even if some time elapses between step 301 and step 302 and the object moves within the coil during that time, therefore, values of $\theta_1$ and $\theta_2$ are hardly affected by the movement. Accordingly, the image quality is not effected by the movement at all. Succeedingly at step 303, inverse Fourier transformation is applied to the signal data train [S₁] obtained at step 302 to obtain the first image $Q_1(x,y)$ expressed by the equation (1) and store it into the memory 19. In the same way, inverse Fourier transformation is applied to the data train [S₂] to obtain the second image $Q_2(x,y)$ expressed by the equation (3) and store it into the memory 20 at step 304. Succeedingly at step 305, $Q_1(x,y)$ and $Q_2(x,y)$ are loaded, and offsets inherent in the apparatus are respectively eliminated by using equations $$Q_1'(x,y) = Q_1(x,y) \cdot \exp(-j\theta_1) \quad (11)$$

$$Q_2'(x,y) = Q_2(x,y) \cdot \exp(-j\theta_2) \quad (12)$$

Further, the right side of the equation (8) is calculated from $Q_1'(x,y)$ and $Q_2'(x,y)$, and the result is stored into the memory 20 again. Further at step 306, data given by the equation (5) are loaded from the memory 20, and the real part $R_e(x,y)$ and the imaginary part $I_m(x,y)$ of data of each pixel are calculated and stored into memories 20 and 21. Finally at step 307, the real part $R_e(x,y)$ and the imaginary part $I_m(x,y)$ are loaded and two chemical shift images $\rho_1(x,y)$ and $\rho_2(x,y)$ are derived respectively from the equations (9) and (10) and are transferred to the display 7 to display respective images.

In the embodiment heretofore described, $\tau$ and $\tau'$ are so set in the measuring sequence of the object that the phase difference $\theta_e$ caused by two chemical shifts in the first echo signal may assume a value other than $2n\pi$ and the phase difference $\theta_e'$ caused by two chemical shifts in the second echo signal may assume a value of $2n\pi$. By especially setting $\tau$ so that $\theta_e$ may become $\pi/2$, however, two chemical shift images $\rho_1(x,y)$ and $\rho_2(x,y)$ can be calculated more easily. A case where $\theta_e = \pi/2$ and $\theta_e' = 2\pi$ will now be described. In this case, the equation (8) can be represented as $$\rho_1(x,y) + j\rho_2(x,y) = Q_1'(x,y) [Q_2'(x,y)/|Q_2'(x,y)|]^{-\frac{1}{4}} \quad (13)$$

The sequence may be so changed that the spin echo $S_2$ may be measured earlier than the spin echo $S_1$. In any case, it is only necessary in the sequence that the spin echoes $S_1$ and $S_2$ appear after spin excitation has been performed once.

Further, a similar effect can be obtained even if $\tau'$ is so set that the phase difference $\theta_e'$ caused by the chemical shifts in the spin echo $S_2$ may not be $2n\pi$ but may be $(2n-1)\pi$ (where n is an integer). Combining both of them, $\tau'$ need only be so set that $\theta_e'$ may become $n\pi$ (where n is an integer). When $\theta_e'$ is $2(n-1)\pi$, the equation corresponding to the equation (3) is represented as $$Q_2(x,y) = \{\rho_1(x,y) - \rho_2(x,y)\} \times \exp\{j\theta_2 + j\gamma E(x,y)\tau'\} \quad (14)$$

The sign of $\rho_2(x,y)$ becomes negative. When an equation corresponding to the equation (7) is to be derived, the sign of $Q_2'(x,y)$ located at the right side of the equation (7) must be inverted according to which of $\rho_1(x,y)$ and $\rho_2(x,y)$ is larger. Since $\rho_1(x,y)$ and $\rho_2(x,y)$ are unknown quantities, however, other information is needed for judging which is larger. In one possible method, a property that the density distribution of water and fat in a living body assumes continuous function is used, for example. Since $E(x,y)$ gradually changes as function of a position in general, its property may also be used.

We claim:

1. An NMR chemical shift imaging method comprising:
   (a) first step of exciting nuclear spins of an object for inspection placed within a static magnetic field;
   (b) second step of applying a phase encode gradient having a programmable time-intensity product to said static magnetic field along a first direction;
   (c) third step of applying first and second 180° RF pulses at a time interval and thereby generating first and second Hahn echoes;
   (d) fourth step of applying a readout gradient having a predetermined intensity to said static magnetic field along a second direction perpendicular to said first direction a plurality of times, generating first and second gradient echoes corresponding to said first and second Hahn echoes, defining time difference between said first Hahn echo and said first gradient echo so as to provide two chemical shifts of spins within said object for inspection with a predetermined phase difference other than $2n\pi$ (where n is an integer), and defining time difference between said second Hahn echo and said second gradient echo so as to provide said two chemical shifts with a phase difference of $2n\pi$;
   (e) fifth step of sampling said first and second gradient echoes under the presence of said readout gradient;
   (f) sixth step of repeating said first to fifth steps a lurality of times while changing the time-intensity produce of said phase encode gradient;
   (g) seventh step of calculating a first image and a second image respectively from a first data train representing the first gradient echo and a second data train representing the second gradient echo obtained at said sixth step; and
   (h) eighth step of calculating two spin distribution images corresponding to said two chemical shifts from said first and second images.

2. An NMR chemical shift imaging method according to claim 1, wherein the time difference between said first Hahn echo and said first gradient echo provides said two chemical shifts with a phase difference of $\pi/2$.

3. An NMR chemical shift imaging method according to claim 1, wherein the time difference between said second Hahn echo and said second gradient provides said two chemical shifts with a phase difference of $n\pi$.

4. An NMR chemical shift imaging method according to claim 1, wherein said method further includes steps of respectively detecting offset phases included in said first and second images which do not depend upon positions, and said eighth step comprises step of deriving two spin distribution images from said first and second images with said offset phases removed.

5. An NMR chemical shift imaging method according to claim 4, wherein said offset phase detecting step comprises step of changing the time difference between said first Hahn echo and said first gradient echo to zero and carrying out said first to seventh steps.

* * * * *